United States Patent
Bando et al.

(10) Patent No.: US 9,773,691 B2
(45) Date of Patent: Sep. 26, 2017

(54) SUBSTRATE CONVEYING SYSTEM

(71) Applicant: KAWASAKI JUKOGYO KABUSHIKI KAISHA, Kobe-shi, Hyogo (JP)

(72) Inventors: Kenji Bando, Nishinomiya (JP); Takuya Fukuda, Kakogawa (JP); Soichi Tamada, Kobe (JP)

(73) Assignee: KAWASAKI JUKOGYO KABUSHIKI KAISHA, Kobe-shi (JP)

( * ) Notice: Subject to any disclaimer, the term of this patent is extended or adjusted under 35 U.S.C. 154(b) by 0 days.

(21) Appl. No.: 14/410,532

(22) PCT Filed: Jun. 10, 2013

(86) PCT No.: PCT/JP2013/003636
§ 371 (c)(1),
(2) Date: Dec. 22, 2014

(87) PCT Pub. No.: WO2013/190800
PCT Pub. Date: Dec. 27, 2013

(65) Prior Publication Data
US 2015/0311103 A1  Oct. 29, 2015

(30) Foreign Application Priority Data
Jun. 21, 2012 (JP) ................ 2012-139883

(51) Int. Cl.
*H01L 21/67* (2006.01)
*H01L 21/677* (2006.01)
(Continued)

(52) U.S. Cl.
CPC ........ *H01L 21/67778* (2013.01); *B65G 19/02* (2013.01); *B65G 49/065* (2013.01);
(Continued)

(58) Field of Classification Search
USPC .................................................. 414/331.17
See application file for complete search history.

(56) References Cited

U.S. PATENT DOCUMENTS 5,337,880 A * 8/1994 Claycomb .......... B65G 47/5181
198/347.3
5,868,549 A * 2/1999 Lee ...................... B65G 57/245
414/676
(Continued)

FOREIGN PATENT DOCUMENTS

JP 2000-128346 A 5/2000
JP 2002-261145 A 9/2002
(Continued)

OTHER PUBLICATIONS

Jan. 19, 2016 extended Search Report issued in European Patent Application No. 13806319.3.
(Continued)

*Primary Examiner* — Patrick J Maestri
(74) *Attorney, Agent, or Firm* — Oliff PLC

(57) ABSTRACT

A substrate conveying system includes a substrate supply unit including a movable rack and an up-down unit which moves the movable rack down, a lift unit which has one or more ejection holes which eject a gas upward and is configured to lift-up the substrate supported on the movable rack by the pressure of the gas ejected through ejection holes when the up-down unit moves the movable rack down, and a conveying unit which includes a conveyor, and hook elements extending upward from the conveyor, and is configured to push in a conveying direction the substrate W being lifted-up by the pressure of the gas ejected through the ejection holes.

9 Claims, 9 Drawing Sheets

(51) Int. Cl.
*B65G 19/02* (2006.01)
*B65G 49/06* (2006.01)
*H01L 21/673* (2006.01)

(52) U.S. Cl.
CPC .... *H01L 21/6732* (2013.01); *H01L 21/67706* (2013.01); *H01L 21/67769* (2013.01); *H01L 21/67784* (2013.01)

(56) References Cited

U.S. PATENT DOCUMENTS

| | | |
|---|---|---|
| 6,336,775 B1 | 1/2002 | Morita et al. |
| 7,908,995 B2 * | 3/2011 | Inamasu .............. B65G 49/065 118/300 |
| 2005/0089388 A1 | 4/2005 | Park |
| 2012/0055761 A1 * | 3/2012 | Truyens ............ H01L 21/67721 198/577 |

FOREIGN PATENT DOCUMENTS

| | | |
|---|---|---|
| JP | A-2005-136411 | 5/2005 |
| JP | A-2007-250871 | 9/2007 |
| JP | A-2008-98198 | 4/2008 |
| JP | A-2010-260658 | 11/2010 |

OTHER PUBLICATIONS

International Search Report issued in PCT/JP2013/003636 dated Aug. 20, 2013.

\* cited by examiner

SUBSTRATE CONVEYING SYSTEM

TECHNICAL FIELD

The present invention relates to a substrate conveying system which conveys substrates. Particularly, the present invention relates to a substrate conveying system which takes the substrates out of a storage case, and conveys the substrates.

BACKGROUND ART

Conventionally, there is known a substrate conveying device which takes (carries) substrates such as glass substrates out of a cassette (see e.g. Patent Literature 1).

This substrate conveying device includes conveying rollers arranged in two rows, and a hand unit. The conveying rollers in the rows are arranged such that they are apart from each other in a direction in which the substrates are conveyed. The hand unit extends in a direction perpendicular to the direction in which the substrates are conveyed, and is positioned to be slightly lower than the conveying rollers. The hand unit has on its upper surface plural ejection holes through which compressed air supplied from a blower or the like is ejected. When the substrates are taken out of the substrate cassette, the both end portions of the lower surface of each of the substrates are directly supported by the conveying rollers, a portion of the substrate which portion is closer to the center than portions thereof which contact the conveying rollers is supported in a non-contact state by the compressed air ejected through the ejections holes, and the conveying rollers are rotated. In this configuration, each of the substrates is taken out of the substrate cassette due to a friction force generated by the contact with the conveying rollers.

CITATION LIST

Patent Literature

Patent Literature 1: Japanese Laid-Open Patent Application Publication NO. 2008-98198

SUMMARY OF INVENTION

Technical Problem

To prevent particles from adhering onto processed surfaces (upper surface and lower surface) of each of the substrates, it is sometimes necessary to reduce the degree of a contact between the processed surfaces of the substrate and the substrate conveying device to a smallest degree, when the substrate is taken out of the substrate cassette.

However, since the conventional substrate conveying device is configured such that the both end portions of the lower surface of each of the substrates contact the conveying rollers, the particles tend to adhere onto the processed surfaces of the substrate.

Solution to Problem

To solve the above described problem associated with the prior art, there is provided a substrate conveying system comprising: a substrate supply unit including a storage ease including a pair of side walls facing each other, and plural pairs of support elements provided on the side walls to support both end portions of plural substrates such that the plural substrates oriented horizontally are arranged to be vertically spaced apart from each other, and a down unit which moves the storage case down; a lift unit having one or more ejection holes which are provided as points or to extend in a conveying direction of the substrates, from at least a region between the pair of side walls of the storage case to a region which is other than the region between the pair of side walls, when viewed from a vertical direction, and eject a gas upward, the lift unit being configured to lift-up the substrate supported on the support elements by a pressure of the gas ejected through the one or more ejection holes, when the down unit moves the storage case down; and a conveying unit including a conveying member extending through the region between the pair of side walls of the storage case of the substrate supply unit and along the one or more ejection holes of the lift unit which are provided as points or to extend in the conveying direction, when viewed from the vertical direction, plural hook elements provided on the conveying member to extend upward such that the hook elements are arranged at intervals which are larger than a dimension of the substrate in the conveying direction, and a drive section for moving the conveying member in the conveying direction, the hook elements being configured to push in the conveying direction upstream end portions of the substrate in the conveying direction, in a state in which the substrate is lifted-up by the pressure of the gas ejected through the ejection holes.

In accordance with this configuration, the substrate conveying system is able to take each of the substrates out of the storage case and convey the substrate, without contacting the obverse surface and reverse surface of the substrate which are other than edges. This makes it possible to prevent particles from adhering onto the obverse surface and reverse surface of the substrate which are other than edges.

The substrate conveying system of the above invention, may comprise: a restricting section extending in the conveying direction and configured to restrict a position of the both end portions of the substrate being conveyed by the conveying unit.

In accordance with this configuration, it becomes possible to prevent the substrate from deviating from the conveying path of the conveying unit by restricting its position.

In the above substrate conveying system, the restricting section may have a pair of restricting sections at both sides of the one or more ejection holes which are provided as points or to extend in the conveying direction such that the restricting sections face each other.

In accordance with this configuration, it becomes possible to prevent the substrate from deviating from a position above the lift unit by restricting the position.

In the above substrate conveying system, the conveying unit may include a pair of endless belts as the conveying member; and the pair of endless belts are driven by the drive section to be rotated such that the hook elements are rotated synchronously with rotation of the endless belts in a state in which the hook elements are arranged in a direction perpendicular to the conveying direction, when viewed from the vertical direction.

In accordance with this configuration, it becomes possible to prevent the substrate pushed by the hook elements from moving sinuously.

Advantageous Effects of Invention

The present invention has been configured as described above, and has advantages that it becomes possible to prevent particles from adhering onto the obverse surface and reverse surface of the substrate which are other than edges.

DESCRIPTION OF EMBODIMENTS

Figure 1:
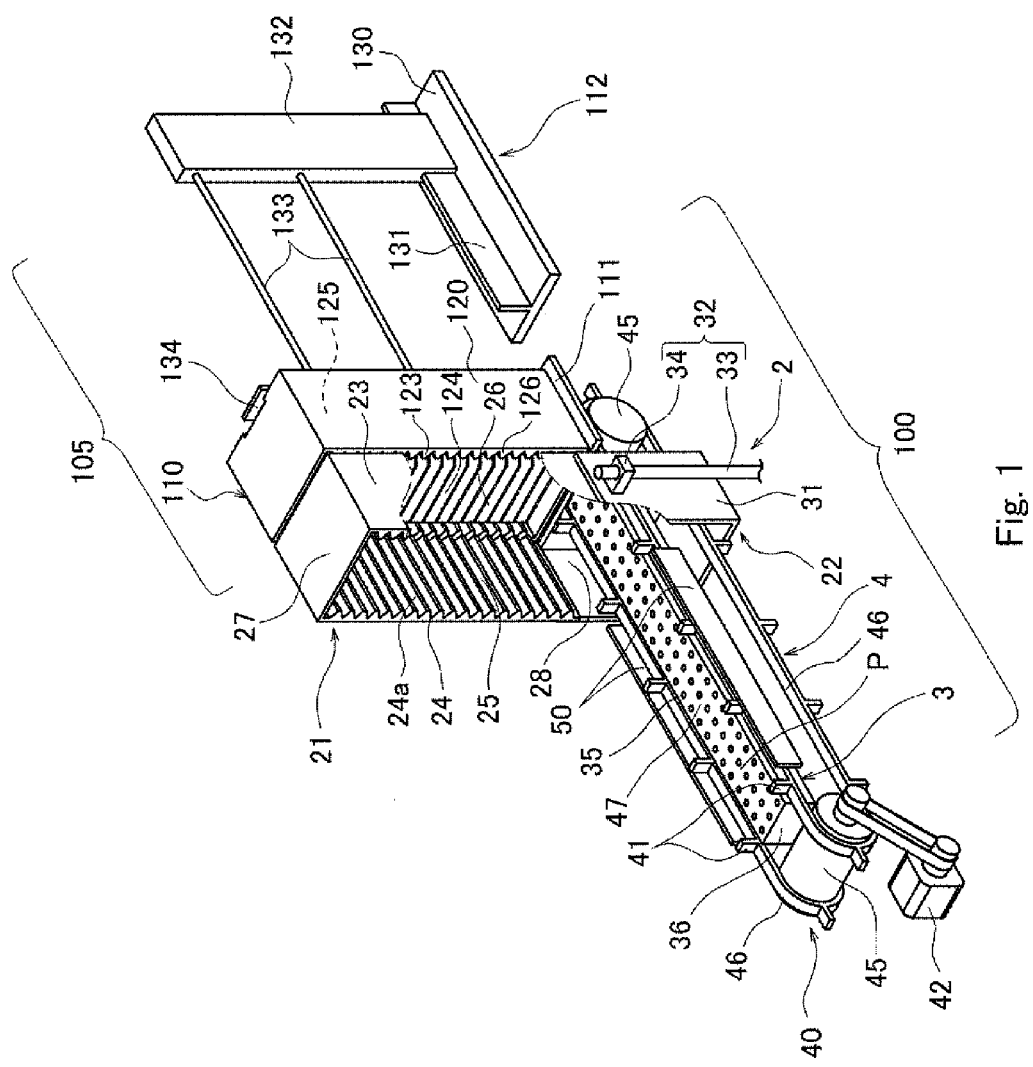
FIG. 1 is a perspective view showing the exemplary configuration of a substrate conveying system according to an embodiment of the present invention.

Hereinafter, the embodiment of the present invention will be described with reference to the drawings. Hereinafter, throughout the drawings, the same or corresponding components are identified by the same reference numerals, and will not be described.

[Overall Configuration]

<Overall Configuration of Substrate Conveying System>

FIG. 1 is a perspective view showing the exemplary configuration of a substrate conveying system 100.

The substrate conveying system 100 is a system configured to convey substrates W. The substrate conveying system 100 is not particularly limited so long as it is configured to convey the substrates. As examples of the substrates, there are cell substrates for a solar cell panel, semiconductor wafers such as silicon wafers, silicon carbide wafers, or sapphire wafers, and glass substrates for a thin display (liquid crystal display, organic EL display, etc.) treated in semiconductor process. In the present embodiment, the substrate conveying system 100 is a system for conveying the cell substrates for the solar cell in a manufacturing line of the solar cell panel.

Hereinafter, in some cases, for easier explanation, a downstream side in the direction in which the substrates are conveyed will be referred to as "forward", and an upstream side in the direction in which the substrates are conveyed will be referred to as "rearward".

As shown in FIG. 1, the substrate conveying system 100 includes a substrate supply unit 2, a lift unit 3, a conveying unit 4, a controller 5 (control unit) (see FIG. 4) for controlling the operation of the substrate conveying system 100, and a frame member for allowing the components of the substrate conveying system 100 to be placed in a predetermined positional relationship. As used herein, the predetermined position refers to a position which is appropriate for performing the conveying operation of the substrates W of the substrate conveying system 100.

[Substrate Supply Unit]

The substrate supply unit 2 includes a movable rack (storage case) 21 in which the substrates W are placed, and an up-down unit (down unit) 22 which moves up and down the movable rack 21.

The movable rack 21 includes a pair of side walls 23 which face each other, and plural pairs of substrate support elements 24 provided on the side walls 23.

In the present embodiment, the movable rack 21 is configured such that the rear wall and lower wall of a cartridge 110 as will be described later are omitted.

As shown in FIG. 1, the pair of side walls 23 of the movable rack 21, which face each other, are arranged in a direction perpendicular to a conveying direction, when viewed from a vertical direction, and an upper wall 27 connects the upper ends of the pair of side walls 23. In this way, a spacing between the pair of side walls 23 is set to a predetermined spacing which is required to place the substrates W on the substrate support elements 24 as will be described later.

The front side and rear side of the movable rack 21 are entirely opened, to form a front opening 25 and a rear opening 26, respectively. This allows the substrates W to be carried into (stored into) and carried (taken) out of the movable rack 21 through the front opening 25 and the rear opening 26. In the present embodiment, as will be described later, the substrates W are carried into the movable rack 21 through the rear opening 26, and carried out of the movable rack 21 through the front opening 25. The lower side of the movable rack 21 is entirely opened to form a lower opening 28. As will be described later, the lift unit 3 and the conveying unit 4 are made closer to the lower surface of the substrate W through the lower opening 28. Although in the present embodiment, the lower opening 28 is provided, the present invention is not limited to this.

Figure 2:
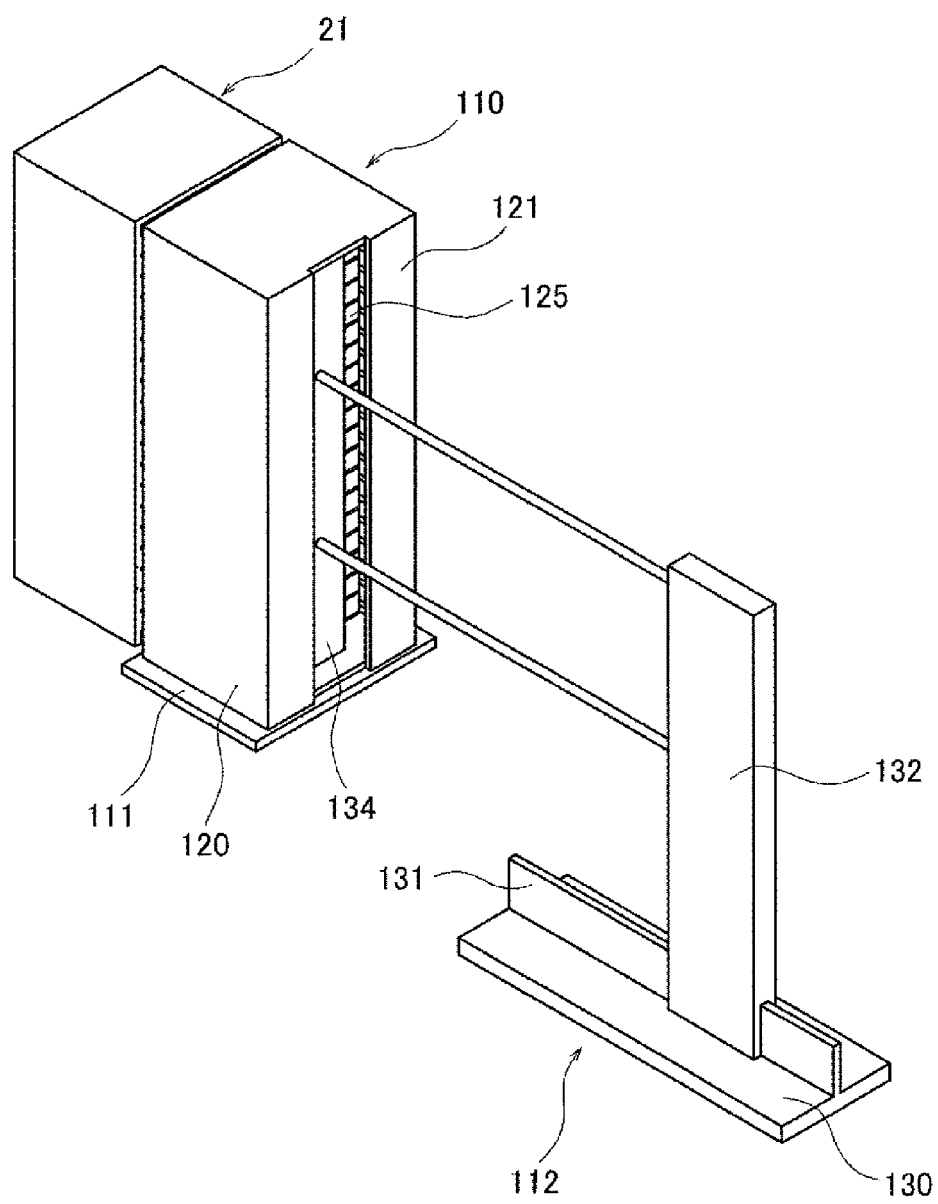
FIG. 2 is a perspective view showing the exemplary configuration of a transfer/loading section of the substrate conveying system of FIG. 1.

The plural pairs of substrate support elements 24 support the both end portions of the plural substrates W such that the plural substrates W oriented horizontally are arranged to be vertically spaced from each other. In the present embodiment, as shown in FIGS. 1 and 2, the plural pairs of substrate support elements 24 are provided on the inner surfaces of the pair of side walls 23. The substrate support element 24 provided on one of the side walls 23 and the corresponding substrate support element 24 provided on the other side wall 23 form one of the pairs. These pairs are provided at predetermined pitches in the vertical direction. Each of the substrate support elements 24 has an inclined surface 24a extending obliquely downward toward the other side wall 23. In a state in which the substrates W are placed on the inclined surfaces 24a of the plural pairs of substrate support elements 24 such that the substrate W bridges a space between the inclined surfaces 24a, the substrate support elements 24 support the both end portions of the plural substrates W such that the plural substrates W oriented horizontally are arranged to be vertically spaced from each other. In this state, the lower corner portions of the substrate W are in contact with the inclined surfaces 24a, and therefore, it becomes possible to prevent the obverse surface and reverse surface of the substrate W which are other than edges from contacting the substrate support element 24.

The up-down unit 22 is mounted to the frame member. It is sufficient that the up-down unit 22 moves up and down the movable rack 21. As an example of the up-down unit 22, for example, there is a lift mechanism including a ball screw mechanism, a fluidic cylinder, or a wire (rope). In the present embodiment, the up-down unit 22 includes a case support section 31 supporting the movable rack 21, and a ball screw mechanism 32 coupled to the case support section 31 and configured to move up and down the case support section 31. The ball screw mechanism 32 includes a ball screw 33, and a slider 34 which is coupled to the case support section 31 and moved up and down according to the rotation of the ball screw 33. When a drive section (not shown) rotates the ball screw 33, the case support section 31 is moved up or down, to move the movable rack 21 between a change position (see FIG. 7) of the cartridge and an end position (see FIG. 9) which is below the change position. In addition, an initial position (see FIG. 8) is set between the change position and the end position. The change position, the end position, and the initial position will be described in detail later.

[Transfer/Loading Section]

In the present embodiment, a transfer/loading section 105 is provided upstream of the movable rack 21 in the conveying direction.

FIG. 2 is a perspective view showing the exemplary configuration of the transfer/loading section 105 of the substrate conveying system 100.

As shown in FIGS. 1 and 2, the transfer/loading section 105 includes a placement table 111 on which the cartridge 110 storing the substrates is placed, and a transfer/loading unit 112 which transfers the substrates stored in the cartridge 110 to the movable rack 21, and loads the substrates into the movable rack 21.

As described above, the movable rack 21 is configured such that the rear wall 121 and the lower wall of the cartridge 110 are omitted. In other words, the cartridge 110 includes a front opening 124 and substrate support elements 123 like the movable rack 21. The substrates W are carried into and out of the cartridge 110 through the front opening 124. The rear wall 121 of the cartridge 110 has a rear opening 125 which is opened so that the upstream end portions of all of the substrates W placed on the substrate support elements 126, in the conveying direction, are exposed.

The placement table 111 is mounted to the frame member. The placement table 111 is positioned upstream of the substrate supply unit 2 in the conveying direction. The upper surface of the placement table 111 extends horizontally. The height of the placement table 111 is set so that the rear ends of the substrate support elements 24 of the movable rack 21 in the change position face the front ends of the substrate support elements 126 of the cartridge 110, respectively, in a state in which the cartridge 110 is placed on the placement table 111.

The transfer/loading unit 112 is positioned upstream of the placement table 111 in the conveying direction. The transfer/loading unit 112 includes a base 130 which is mounted to the frame member and has a rail 131 extending in the conveying direction, a movable base 132 which is guided by the rail 131 to be movable to an upstream side or a downstream side in the conveying direction, push-in arms 133 extending horizontally from the movable base 132 to the downstream side in the conveying direction, a push-in plate 134 provided at the tip end of the push-in arms 133, and a drive section (not shown) which moves the movable base 132 to the upstream side or the downstream side in the conveying direction.

In the transfer/loading unit 112, when the movable base 132 moves to the downstream side in the conveying direction, the push-in plate 134 is inserted into the cartridge 110 through the rear opening 125 of the cartridge 110, and pushes the end portions of all of the substrates W stored in the cartridge 110 to the downstream side in the conveying direction. Since the front ends of the substrate support elements 126 of the cartridge 110 face the rear ends of the plural pairs of substrate support elements 24 of the movable rack 21, respectively, the pushed substrates slide on the substrate support elements 126 of the cartridge 110, and are placed on the inclined surfaces 24a of the movable rack 21.

[Lift Unit]

Figure 3:
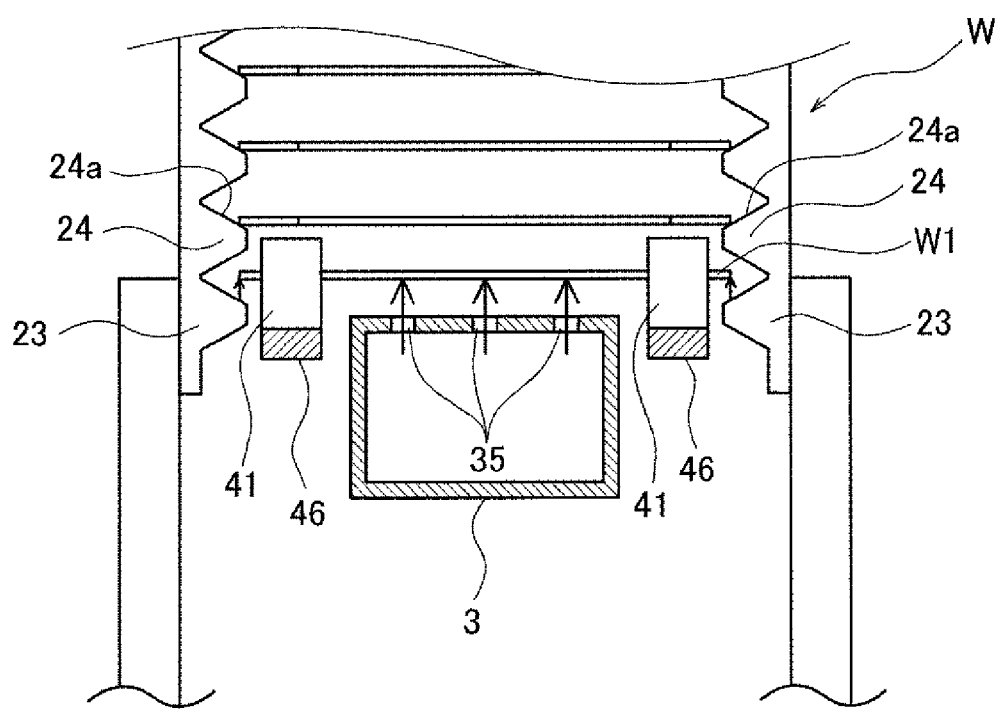
FIG. 3 is a view showing the exemplary structure for lifting-up substrates of the substrate conveying system of FIG. 1, when the substrate conveying system is viewed from rear.

FIG. 3 is a view showing the exemplary structure for lifting-up the substrate of the substrate conveying system 100, when the substrate conveying system 100 is viewed from rear.

As shown in FIGS. 1 and 3, the lift unit 3 has one or more ejection holes 35.

In the present embodiment, the lift unit 3 includes a based body 36, and a drive section (e.g., pressurizing pump) which is not shown. The ejection holes 35 are formed in the base body 36.

The base body 36 is a hollow box extending horizontally in the direction in which the substrates W are conveyed. The upstream end portion of the base body 36 is located within the lower opening 28 of the movable rack 21 when viewed from a vertical direction. Therefore, the base body 36 extends in the direction in which the substrates W are conveyed, through a space between the pair of side walls 23 of the movable rack 21, when viewed from a vertical direction. The base body 36 is mounted to the frame member.

As shown in FIGS. 1 and 3, the base body 36 is configured such that its width, i.e., dimension in the direction which is perpendicular to the conveying direction, when viewed from the vertical direction, is set smaller than the dimension of the lower opening 28 of the movable rack 21, in the direction which is perpendicular to the conveying direction. This allows the lift unit 3 to be positioned between the pair of side walls 23 of the movable rack 21 (see FIGS. 7 to 9).

One or more ejection holes 35 are provided as points or to extend in the direction in which the substrates W are conveyed, from at least a region between the pair of side walls 23 of the movable rack 21, to a region which is other than the region between the side walls 23, when viewed from a vertical direction, and eject a gas upward. In the present embodiment, many ejection holes 35 are provided as points on the entire upper surface of the base body 36.

The drive section of the lift unit 3 operates to supply air (gas) to the base body 36. Thereby, the air is ejected upward (including right above and obliquely upward) through the ejection holes 35. By the pressure of the gas ejected through the ejection holes 35, the substrate W1 of FIG. 3 which is supported on the substrate support elements 24 of the movable rack 21 can be lifted-up. The term "lifted-up" means that the obverse surface and reverse surface of the substrate W, which face the lift unit 3, do not contact the lift unit 3.

Figure 8:
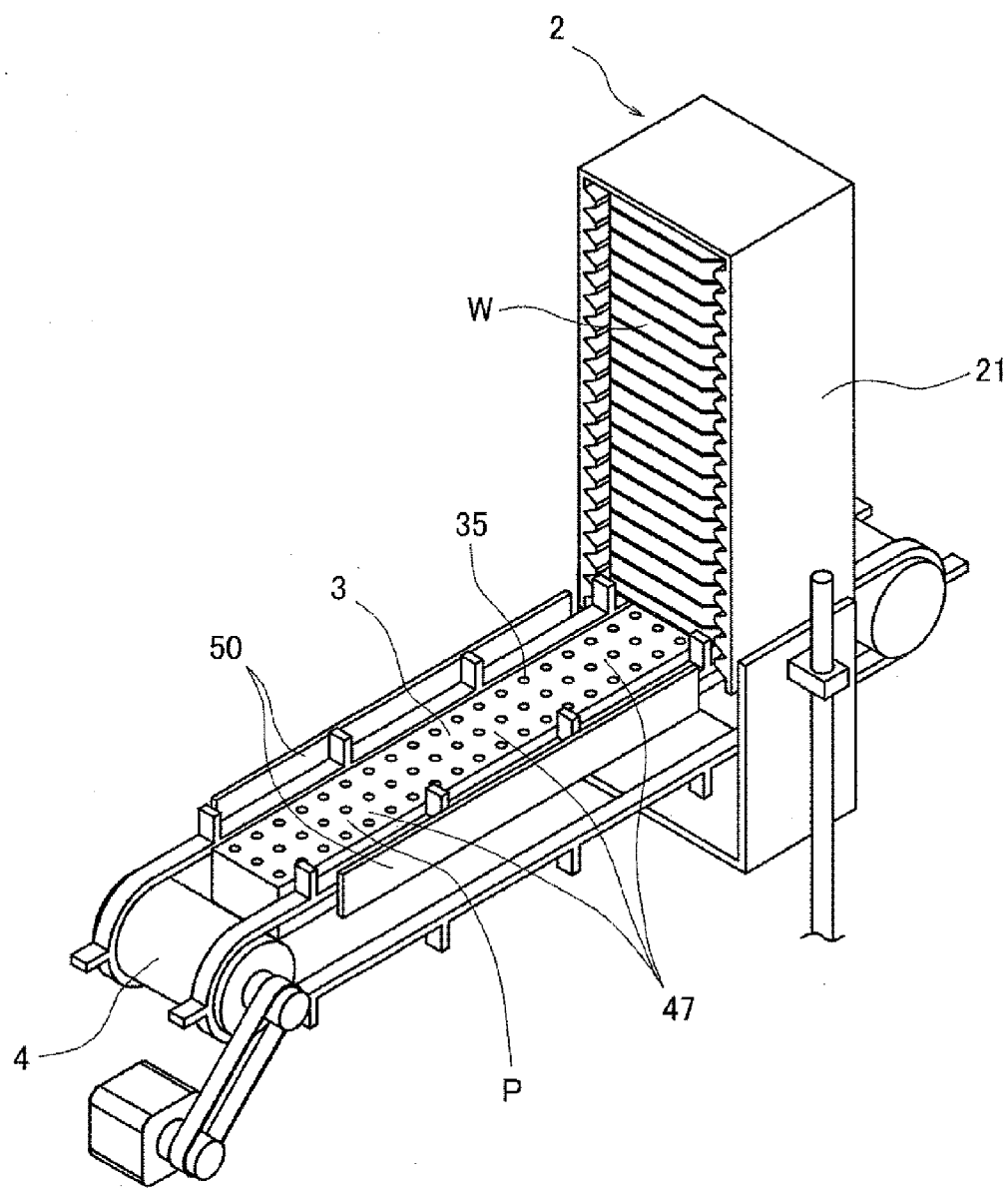
FIG. 8 is a view showing the exemplary operation of the substrate conveying system of FIG. 1.

The initial position of the movable rack 21 is defined as, for example, a position at which the substrate W supported on the substrate support elements 24 in a lowermost stage, of the substrate support elements 24 of the movable rack 21, is lifted-up by the pressure of the gas ejected through the ejection holes 35 (see FIGS. 3 and 8). The end position of the movable rack 21 is defined as, for example, a position at which the substrate W supported on the substrate support elements 24 in an uppermost stage, of the substrate support elements 24 of the movable rack 21, is lifted-up by the pressure of the gas ejected through the ejection holes 35 (see FIG. 9)

[Conveying Unit]

The conveying unit 4 includes a conveyor (conveying member) 40, hook elements 41 extending upward from the conveyor 40, and a drive section 42 which moves the conveyor 40 in the conveying direction.

The conveyor 40 extends through the space between the pair of side walls 23 of the movable rack 21 of the substrate supply unit 2 and along the ejection holes 35 of the lift unit 3, when viewed from the vertical direction. The upper surface of the conveyor 40 constitutes a conveying path of the substrate. In the present embodiment, the upstream end portion of the conveyor 40 in the conveying direction, is positioned between the pair of side walls 23 of the movable rack 21, when viewed from the vertical direction. A handover position P is set in the downstream end portion of the conveyor 40 in the conveying direction. The handover position P is a position at which a transfer unit 150 (see FIG. 4) takes (carries) out the substrate W. The transfer unit 150 transfers the substrate W carried out from the handover position P to other position. As an example of the transfer unit, there is a delta robot attached with a suction hand of a well-known Bernoulli type.

The conveyor 40 has a pair of endless belts 46. The pair of endless belts 46 are wrapped around a pair of sprockets 45. The lift unit 3 is positioned in a region surrounded by the pair of endless belts 46 and the pair of sprockets 45, when viewed from the vertical direction. The drive section 42 rotates one of the sprockets 45 by a driving force, and as a result, the pair of endless belts 46 are rotated synchronously. In this way, the drive section 42 moves the conveyor 40 in the conveying direction.

The hook elements 41 are provided on the conveyor 40 to extend upward such that they are arranged at intervals which are larger than the dimension of the substrate W in the conveying direction. The length of the hook elements 41 is set so that their tip ends are located higher than the substrate being lifted-up. This allows the hook elements 41 to push in the conveying direction the upstream end portions of the substrate in the conveying direction, in a state in which substrate is lifted-up by the pressure of the gas ejected through the ejection holes 35. In the present embodiment, plural pairs of the hook elements 41 are provided to extend upward on the obverse surfaces of the pair of endless belts 46. The hook element 41 provided on one of the endless belts 46 and the hook element 41 provided on the other endless belt 46 form a pair. The pair of hook elements 41 are arranged side by side in the direction perpendicular to the conveying direction, when viewed from the vertical direction. Therefore, when the drive section 42 causes the pair of endless belts 46 to be rotated by the driving force, the pair of hook elements are rotated synchronously in a state in which they are arranged in the direction perpendicular to the conveying direction. The hook elements 41 are provided to extend upward at pitches which are slightly larger than the dimension of the substrate W in the conveying direction. The hook elements 41 have a rectangular parallel-piped shape and protrude outward from the endless belts 46. Between the pair of hook elements 41 and adjacent hook elements 41, a substrate retaining region 47 for retaining the substrate W is formed.

In accordance with the conveyor 40 configured as described above, when the substrate W is positioned in the substrate retaining region 47 in a state in which the gas is ejected through the ejection holes 35, the substrate W is lifted-up by the pressure of the ejected gas. In this state, the position of the substrate W in the conveying direction is restricted by the pairs of hook elements 41 which are adjacent to the upstream and downstream end portions of the substrate W in the conveying direction. When the pair of endless belts 46 are rotated, this substrate W is pushed to the downstream side in the conveying direction by the pairs of hook elements 41 at the upstream side in the conveying direction and conveyed to the handover position P. As described above, since the substrate W is pushed by the pairs of hook elements 41 when it is conveyed, it is less likely to move sinuously.

[Guide]

In the present embodiment, the substrate conveying system 100 further includes a pair of guides (restricting section) 50 extending in the conveying direction. The guides 50 are elongated-rectangular-plate-shaped members mounted to the frame member. The pair of guides 50 are provided at both sides of the conveyor 40, i.e., both sides of the lift unit 3 such that the guides 50 face each other. The pair of guides 50 are placed downstream of the substrate supply unit 2 in the conveying direction and adjacently to the substrate supply unit 2. The spacing between the pair of guides 50 is set slightly larger than the width of the substrate W in the direction perpendicular to the conveying direction. This allows the pair of guides 50 to restrict the positions of the substrate W to be conveyed, the positions being in the direction from one of the both end portions to the other end portion of the substrate W (in the direction perpendicular to the conveying direction, when viewed from the vertical direction). Since the horizontal position of the substrate on the conveyor 40 is restricted by the hook elements 41 and the guides 50, the substrate is conveyed to the handover position P such that the substrate does not deviate from the substrate retaining region 47.

[Configuration of Control System]

Figure 4:
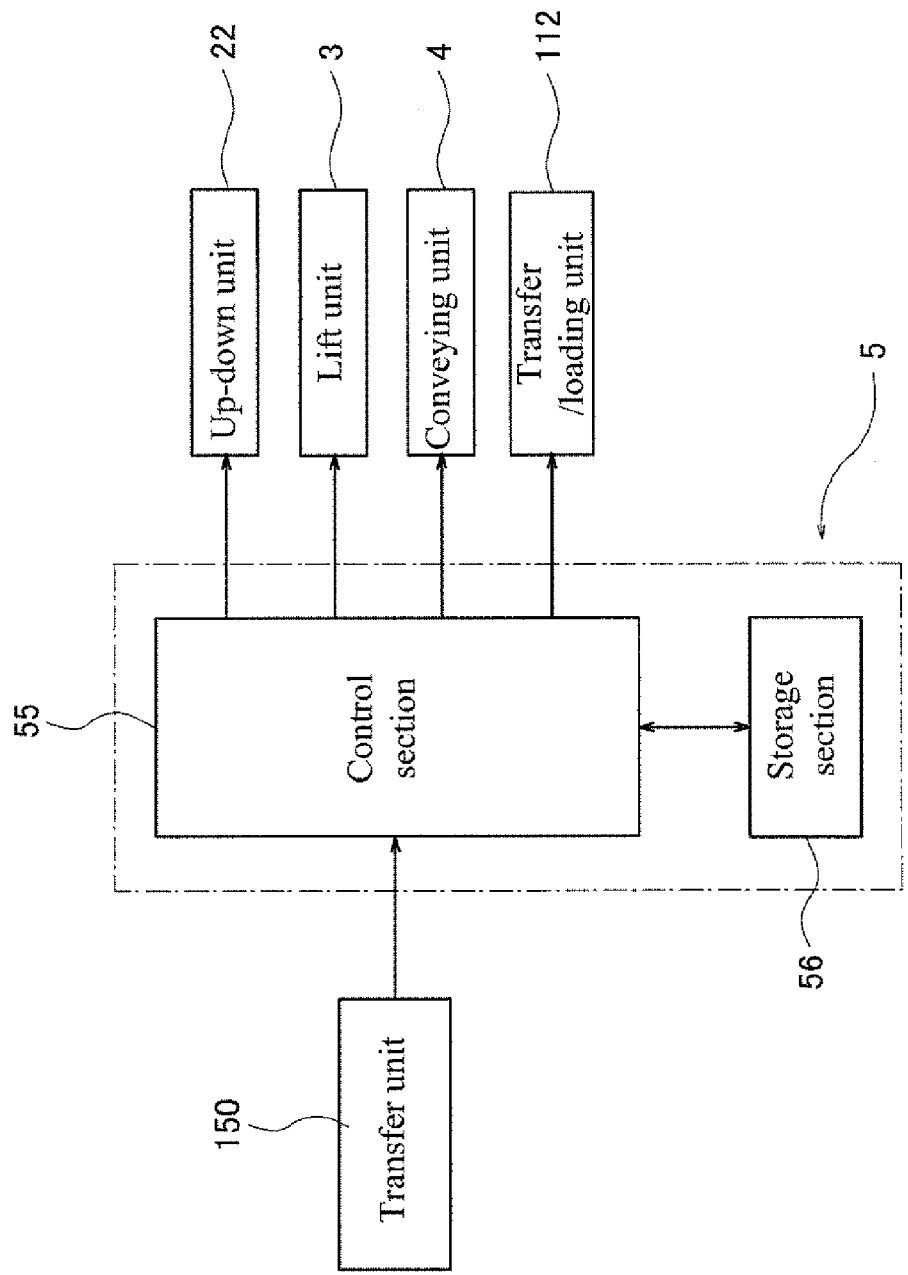
FIG. 4 is a block diagram schematically showing the exemplary configuration of a control system of the substrate conveying system of FIG. 1.

FIG. 4 is a block diagram schematically showing the exemplary configuration of a control system of the substrate conveying system 100. Hereinafter, the control system of the substrate conveying system 100 will be described with reference to FIG. 4.

The controller 5 of the substrate conveying system 100 includes a control section 55 including, for example, a processor such as CPU, and a storage section 56 including a memory such as ROM and RAM. The control section 55 may be constituted by a single control unit which performs centralized control or plural control units which cooperate with each other to perform distributed control. The control section controls the operations of the drive sections of the up-down unit 22, the lift unit 3, the conveying unit 4, and the transfer/loading unit 112, thereby controlling the operations of these units. For example, specified control programs are stored in the storage section 56. The control section 55 reads these control programs, and executes the control programs, to control the operation of the substrate conveying system 100. A substrate transfer completion signal output from the transfer unit 150 is input to the control section 55. In FIG. 4, arrows indicate the transmission direction of signals.

[Exemplary Operation]

Next, the exemplary operation of the substrate conveying system 100 will be described. The operation is carried out by the controller 5's operation for controlling the operations of the drive sections of the up-down unit 22, the lift unit 3, the conveying unit 4, and the transfer/loading unit 112.

Figure 5:
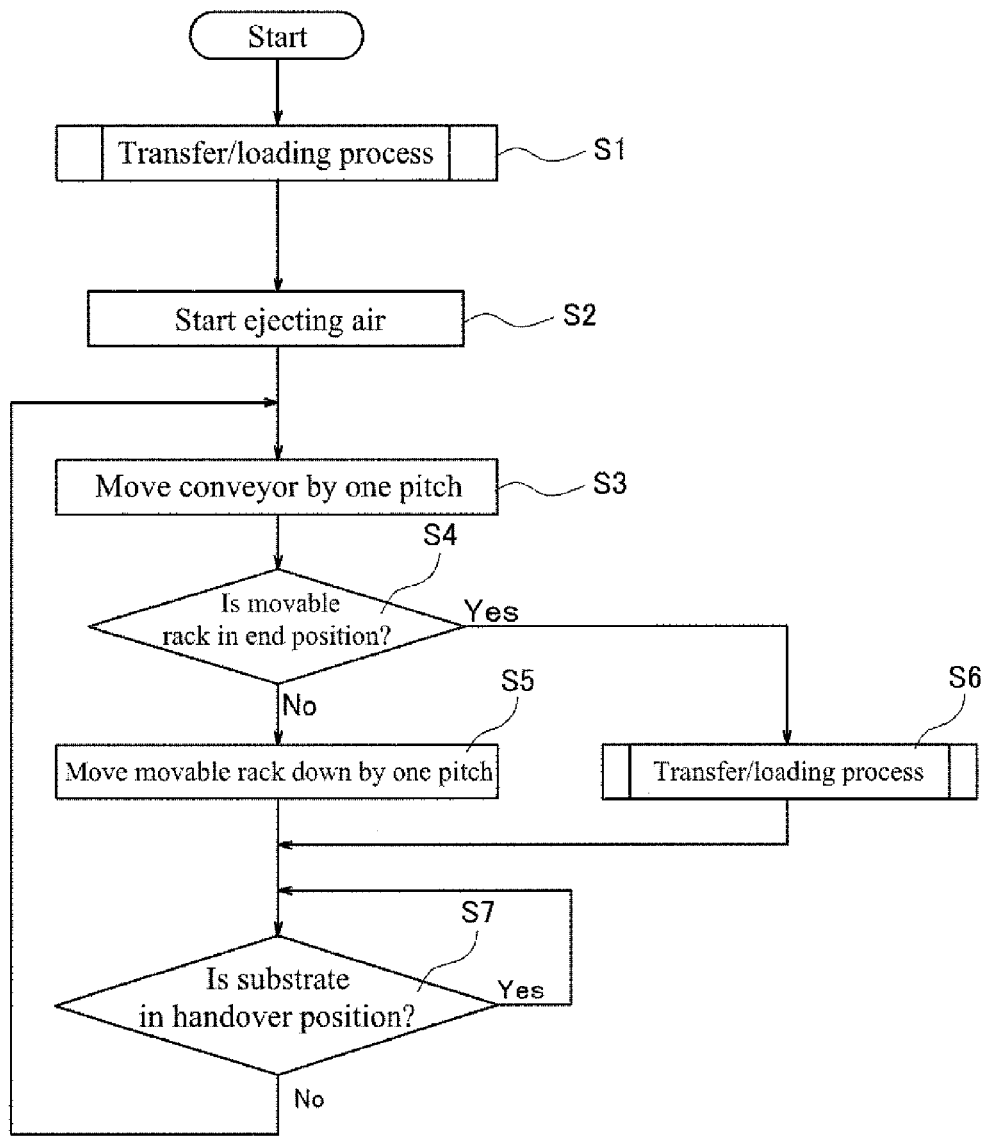
FIG. 5 is a flowchart showing the exemplary operation of the substrate conveying system of FIG. 1.
Figure 6:
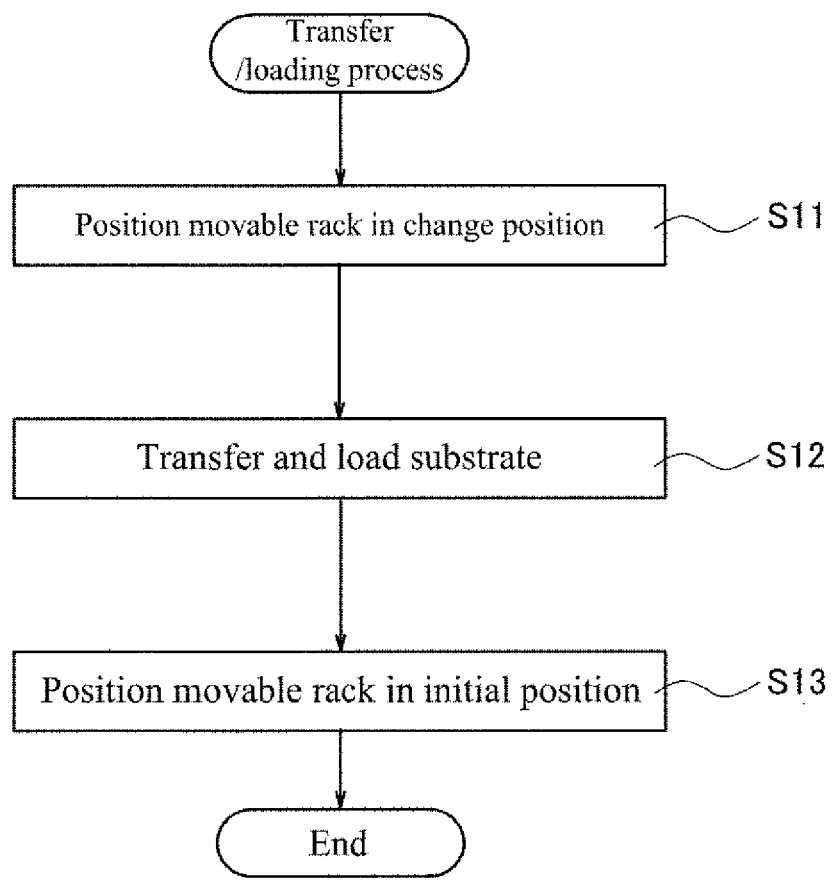
FIG. 6 is a flowchart showing the exemplary operation of the substrate conveying system of FIG. 1.
Figure 7:
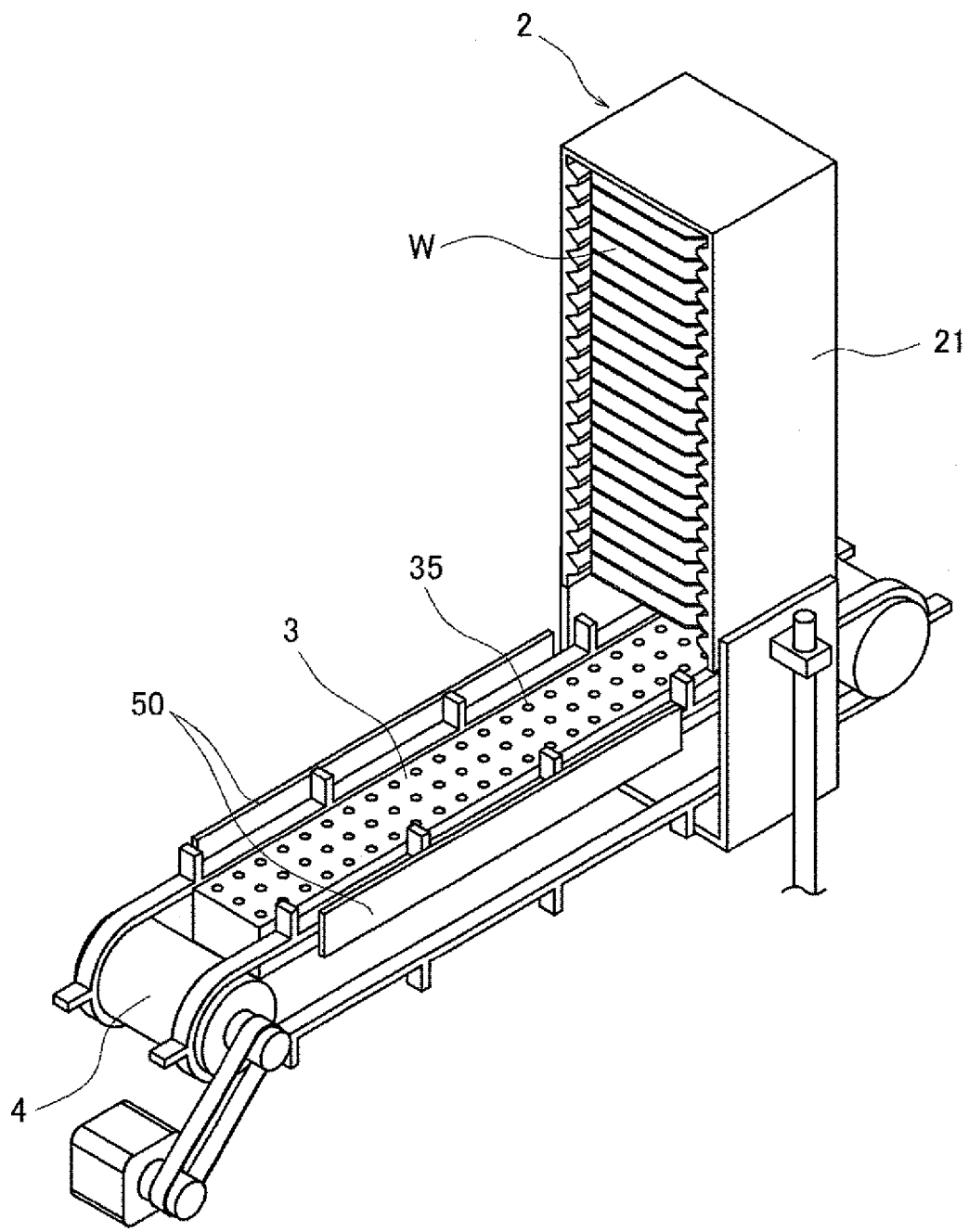
FIG. 7 is a view showing the exemplary operation of the substrate conveying system of FIG. 1.
Figure 9:
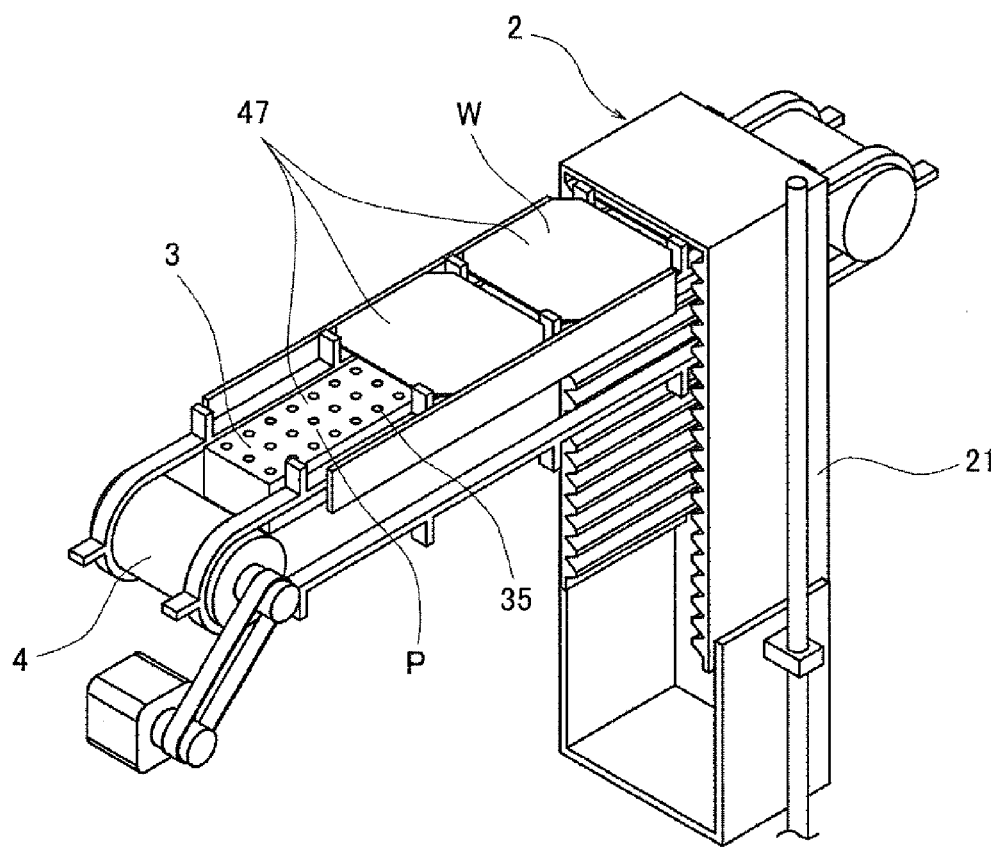
FIG. 9 is a view showing the exemplary operation of the substrate conveying system of FIG. 1.

FIG. 5 is a flowchart showing the exemplary operation of the substrate conveying system 100. FIG. 6 is a flowchart showing the exemplary operation of the transfer/loading process of the substrate conveying system 100. FIGS. 7 to 9 are flowcharts showing the exemplary operation of the substrate conveying system 100.

Initially, the control section 55 performs the transfer/loading process for transferring the substrates from the cartridge 110 and loading them into the movable rack 21 (step S21). The transfer/loading process is performed as follows.

Firstly, the control section 55 positions the movable rack 21 in the change position of FIG. 7 (step S11).

Then, the control section 55 pushes the push-in plate 134 of the transfer/loading unit 112 into the cartridge 110 through the rear opening 125 (step S12). Thereby, all of the substrates W are transferred from the cartridge 110 and loaded into the movable rack 21.

Then, the control section 55 moves the movable rack 21 down to the initial position of FIG. 8 (step S13). Thereby, the transfer/loading process is completed.

Then, the control section 55 drives the lift unit 3 to eject the air upward through the ejection holes 35 (step S2). This causes the substrate W supported on the substrate support elements 24 in a lowermost stage, of the substrate support elements 24 of the movable rack 21, to be lifted-up by the pressure of the gas ejected through the ejection holes 35. At this time, the hook elements 41 restrict the position of the substrate W in the conveying direction, and the pair of side walls 23 restrict the position of the substrate W in the direction perpendicular to the conveying direction. Therefore, the substrate W is retained in the substrate retaining region 47.

Then, the control section 55 rotates the conveyor 40 so that the substrate retaining region 47 which is adjacent to the upstream side of the substrate retaining region 47 in which the substrate W is retained, in the conveying direction, is positioned under the substrate W stored in the movable rack 21. More specifically, the pair of endless belts 46 are rotated by one pitch (step S3). Thereby, the substrate W located in the substrate retaining region 47, is conveyed to the downstream side in the conveying direction. At this time, the hook elements 41 restrict the position of the substrate W in the conveying direction, and the pair of guides 50 restrict the position of the substrate W in the direction perpendicular to the conveying direction. Therefore, the substrate W is retained in the substrate retaining region 47.

Then, the control section 55 determines whether or not the movable rack 21 is in the end position of FIG. 9.

When the control section 55 determines that the movable rack 21 is not in the end position (NO in step S4), the control section 55 moves the movable rack 21 down by one pitch (step S5). This causes the substrate W which is adjacent to and above the above mentioned substrate W to be lifted-up by the pressure of the gas ejected through the ejection holes 35.

On the other hand, when the control section 55 determines that the movable rack 21 is in the end position (YES in step S4), the control section 55 performs the transfer/loading process (step S6).

Then, the control section 55 stands-by until it determines that the substrate is not in the handover position P, based on, for example, the substrate transfer completion signal received from the transfer unit 150 (step S7). In other words, the control section 55 stands-by until the substrate W is carried out, when the transfer unit 150 has not completed transferring the substrate W in the handover position.

When the control section 55 determines that the substrate is not in the handover position P, the control section 55 performs the operation of step S3 again.

As described above, the substrate conveying system 100 of the present invention is able to take each of the substrates W out of the movable rack 21, convey the substrate W and position the substrate W in the handover position P, without contacting the obverse surface and reverse surface of the substrate W which are other than edges. This makes it possible to prevent particles from adhering onto the obverse surface and reverse surface of the substrate W which are other than edges.

Modified Example

Although in the above described embodiment, the transfer/loading unit 112 transfers the substrates W stored in the cartridge 110 and loads them into the movable rack 21, the present invention is not limited to this. Alternatively, an operator may manually insert the substrates W into the movable rack 21. Or, the movable rack 21 in which the substrates W are stored may be exchanged with the movable rack 21 from which the substrates W have been carried out.

Although in the above described embodiment, the pair of guides 50 are provided at both sides of the conveying unit 4, the present invention is not limited to this. Alternatively, for example, the guide 50 may be provided at one side of the conveying unit 4. In this case, the lift unit 3 may be inclined toward the guide 50. In this configuration, the substrate W being lifted-up by the pressure of the air ejected through the ejection holes 35 of the lift unit 3, is moved toward the side at which guide 50 is located, and the position of the substrate W in the direction perpendicular to the conveying direction, is restricted by the guide 50.

Moreover, the gas ejected through the ejection holes 35 is not limited to the air, and a desired gas may be used.

Numeral modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

A substrate conveying system of the present invention is effectively applicable to a manufacturing line of cell substrates for a solar cell panel, semiconductor used to fabricate fine circuits on substrates, display panels, etc.

REFERENCE SIGNS LIST 2 substrate supply unit
3 lift unit
4 conveying unit
5 controller
21 movable rack
22 up-down unit
23 side wall
24 substrate support element
24a inclined surface
25 front opening
26 rear opening
27 upper wall
28 lower opening
31 case support section
32 ball screw mechanism
33 ball screw
34 slider
35 ejection holes
36 base body
40 conveyor
41 hook element 42 drive section
45 sprocket
46 endless belt
47 substrate retaining region
50 guide
55 control section
56 storage section
100 substrate conveying system
105 transfer/loading section
110 cartridge
111 placement table
112 transfer/loading unit
121 rear wall
123 substrate support element
124 front opening
125 rear opening
126 substrate support element
130 base
131 rail
132 movable base
133 push-in arm
134 push-in plate
150 transfer unit

The invention claimed is:

1. A substrate conveying system comprising:
a substrate supply unit including a storage case including a pair of side walls facing each other, and plural pairs of support elements provided on the side walls to support two end portions of each of plural substrates, the two end portions being in a direction perpendicular to a conveying direction of the plural substrates when viewed from a vertical direction such that the plural substrates oriented horizontally are arranged to be vertically spaced apart from each other, and a down unit which moves the storage case down;
a lift unit having one or more ejection holes which are provided as points or to extend in the conveying direction of the plural substrates, from at least a region between the pair of side walls of the storage case to a region which is other than the region between the pair of side walls, when viewed from the vertical direction, and eject a gas upward, the lift unit being configured to lift-up one substrate of the plural substrates supported on the support elements by a pressure of the gas ejected through the one or more ejection holes toward a surface of the one substrate, when the down unit moves the storage case down; and
a conveying unit including (i) a conveying member extending through the region between the pair of side walls of the storage case of the substrate supply unit and along the one or more ejection holes of the lift unit which are provided as points or to extend in the conveying direction, when viewed from the vertical direction, while avoiding contact with the surface of the one substrate, which faces the conveying member and is being lifted-up from the conveying member by the pressure of the gas, (ii) plural hook elements provided on the conveying member to extend upward such that the hook elements are arranged at intervals which are larger than a dimension of the one substrate in the conveying direction, and (iii) a drive section for moving the conveying member in the conveying direction, the hook elements being configured to push upstream end portions of the one substrate in the conveying direction, in a state in which the one substrate is lifted-up by the pressure of the gas ejected through the ejection holes.

2. The substrate conveying system according to claim 1, further comprising:
a restricting section extending in the conveying direction and configured to restrict positions of the one substrate being conveyed by the conveying unit, the positions being in a direction from one of the both end portions of the one substrate to the other end portion.

3. The substrate conveying system according to claim 2, wherein the restricting section has a pair of restricting sections at both sides of the one or more ejection holes which are provided as points or to extend in the conveying direction of the conveying unit such that the restricting sections face each other.

4. The substrate conveying system according to claim 1, wherein the conveying unit includes a pair of endless belts as the conveying member; and
the pair of endless belts are driven by the drive section to be rotated such that the hook elements are rotated synchronously with rotation of the endless belts in a state in which the hook elements are arranged in a direction perpendicular to the conveying direction, when viewed from the vertical direction.

5. The substrate conveying system according to claim 4, further comprising:
a pair of sprockets around which the pair of endless belts are wrapped,
wherein at least one of the pair of sprockets is the drive section, and
wherein the lift unit is placed in a region surrounded by the pair of endless belts and the pair of sprockets when viewed from the vertical direction.

6. The substrate conveying system according to claim 1, wherein lower end portions of the pair of side walls of the storage case are spaced apart from each other.

7. The substrate conveying system according to claim 1, further comprising:
a loading unit which loads the plural substrates into the storage case.

8. The substrate conveying system according to claim 1, wherein tip ends of the hook elements are located above the conveying member and the one substrate being lifted up by the pressure of the gas ejected through the one or more ejection holes.

9. The substrate conveying system according to claim 1, wherein tip ends of the hook elements are located below a second one of the plural substrates, which is located above the one substrate being lifted-up by the pressure of the gas ejected through the one or more ejection holes toward the surface of the one substrate, in a state in which the down unit moves the storage case down.

* * * * *